United States Patent
Yin et al.

(10) Patent No.: US 11,128,126 B2
(45) Date of Patent: Sep. 21, 2021

(54) INTERNAL VOLTAGE-CANCELING CIRCUIT AND USB DEVICE USING THE SAME

(71) Applicants: HONGFUJIN PRECISION ELECTRONICS (ZHENGZHOU) CO., LTD., Zhengzhou (CN); HON HAI PRECISION INDUSTRY CO., LTD., New Taipei (TW)

(72) Inventors: Ji-Xiang Yin, Zhengzhou (CN); Jiang-Feng Shan, Zhengzhou (CN); Xiao-Qing Zhang, Zhengzhou (CN); Bo Zhang, Shenzhen (CN)

(73) Assignees: HONGFUJIN PRECISION ELECTRONICS (ZHENGZHOU) CO., LTD., Zhengzhou (CN); HON HAI PRECISION INDUSTRY CO., LTD., New Taipei (TW)

( * ) Notice: Subject to any disclaimer, the term of this patent is extended or adjusted under 35 U.S.C. 154(b) by 309 days.

(21) Appl. No.: 16/394,341

(22) Filed: Apr. 25, 2019

(65) Prior Publication Data
US 2020/0235569 A1    Jul. 23, 2020

(30) Foreign Application Priority Data
Jan. 17, 2019    (CN) .......................... 201910045299.5

(51) Int. Cl.
| H02H 7/20 | (2006.01) |
| H03K 17/687 | (2006.01) |
| G06F 13/42 | (2006.01) |
| G06F 13/40 | (2006.01) |

(52) U.S. Cl.
CPC ........... *H02H 7/20* (2013.01); *G06F 13/4068* (2013.01); *G06F 13/4282* (2013.01); *H03K 17/6871* (2013.01)

(58) Field of Classification Search
CPC .. H02H 7/40; H02H 5/12; H02H 9/00; H02H 9/02; H02H 9/04; G06F 13/382; G06F 13/4282; G06F 1/3287; G06F 1/1635; G06F 1/28; G06F 2213/0042; H03K 17/6871; H03K 19/018521; H02J 7/022; H02J 7/0093; H02J 2007/0062; H02J 2007/0059
See application file for complete search history.

(56) References Cited

U.S. PATENT DOCUMENTS

| 9,710,037 | B1 * | 7/2017 | Wade | G07G 1/12 |
| 9,787,115 | B2 * | 10/2017 | Lin | H02J 7/007 |
| 2008/0288707 | A1 * | 11/2008 | Nicolet | G06F 13/4068 710/310 |
| 2011/0029703 | A1 * | 2/2011 | Huo | G06F 13/4068 710/110 |
| 2017/0033558 | A1 * | 2/2017 | Chang Chien | H01R 13/641 |
| 2019/0196924 | A1 * | 6/2019 | Gregg | G06F 13/4068 |

\* cited by examiner

*Primary Examiner* — Thienvu V Tran
*Assistant Examiner* — Shahzeb K Ahmad
(74) *Attorney, Agent, or Firm* — ScienBiziP, P.C.

(57) ABSTRACT

A protection circuit of a USB device can interrupt and restore the electrical coupling between a first interface and a second interface of the USB device as a user requires. A controlling module of the protection circuit outputs a first low-level signal or a second high-level signal according to a user operation, a switching module thereby connects or disconnects the first interface to or from the second interface according to the signal received. A USB device is also disclosed.

19 Claims, 3 Drawing Sheets

INTERNAL VOLTAGE-CANCELING CIRCUIT AND USB DEVICE USING THE SAME

FIELD

The subject matter herein generally relates to protection circuit and USB device using the same.

BACKGROUND

Some electronic products use the universal serial bus (USB) interface for data and power transmission. However, the USB will directly output a voltage when connected to a charging source, an electric shock may occur.

Therefore there is a room for improvement.

BRIEF DESCRIPTION OF THE DRAWINGS

Implementations of the present disclosure will now be described, by way of embodiment, with reference to the attached figures.

DETAILED DESCRIPTION

Figure 1:
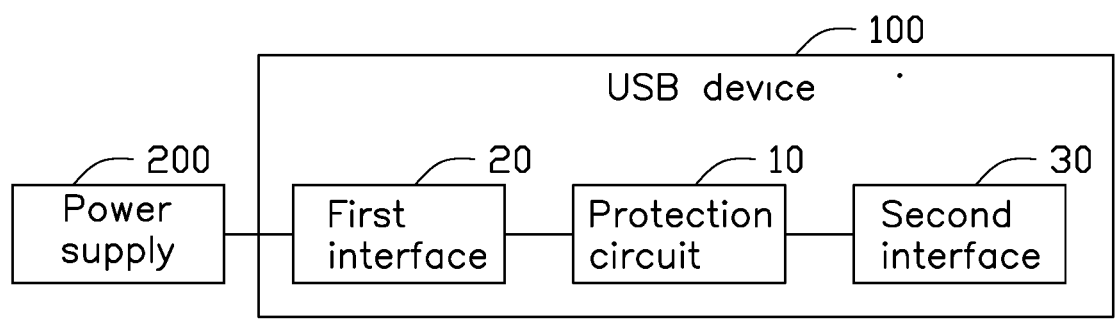
FIG. 1 is a schematic diagram of an embodiment of a USB device.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

Figure 2:
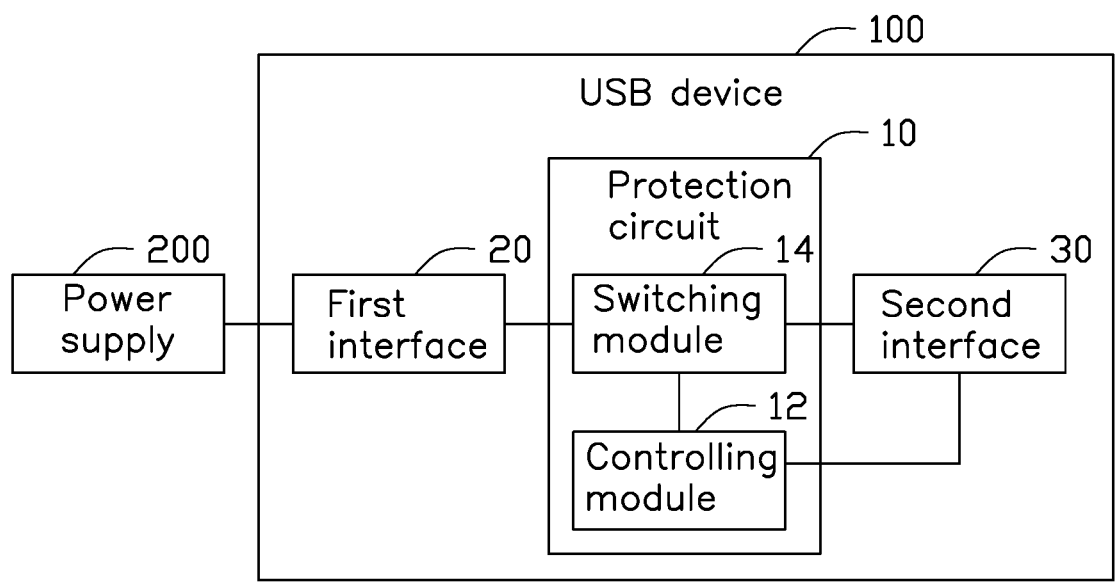
FIG. 2 is another schematic diagram of an embodiment of the USB device.

FIGS. 1 and 2 illustrate a universal serial bus (USB) device (device 100) in accordance with an embodiment of the present disclosure.

The device 100 includes a protection circuit 10, a first interface 20, and a second interface 30.

The first interface 20 is electrically coupled to a power supply 200, and the second interface 30 is used to pass current to an external device (not shown).

The protection circuit 10 is electrically coupled between the first interface 20 and the second interface 30. The protection circuit 10 controls a connection between the first interface 20 and the second interface 30 according to an operation of a user.

When the protection circuit 10 turns on the connection between the first interface 20 and the second interface 30, the power supply 200 outputs voltage to supply power to the external devices through the first interface 20 and the second interface 30.

In at least one embodiment, the protection circuit 10 includes a controlling module 12 and a switching module 14.

The controlling module 12 outputs signal controlling different level states according to an operation of the user.

The switching module 14 is electrically coupled between the first interface 20 and the second interface 30. The switching module 14 receives the signal from the controlling module 12 and turns the connection between the first interface 20 and the second interface 30 on or off according to the signal.

For example, when the controlling module 12 outputs the signal at low-voltage level, such as logic 0, the switching module 14 turns on the connection between the first interface 20 and the second interface 30. When the controlling module 12 outputs the signal at a high-voltage level, such as logic 1, the switching module 14 turns off the connection between the first interface 20 and the second interface 30.

Therefore, the protection circuit 10 can control the connection between the first interface 20 and the second interface 30 under the operation of the user, electric shocks can be avoided.

Figure 3:
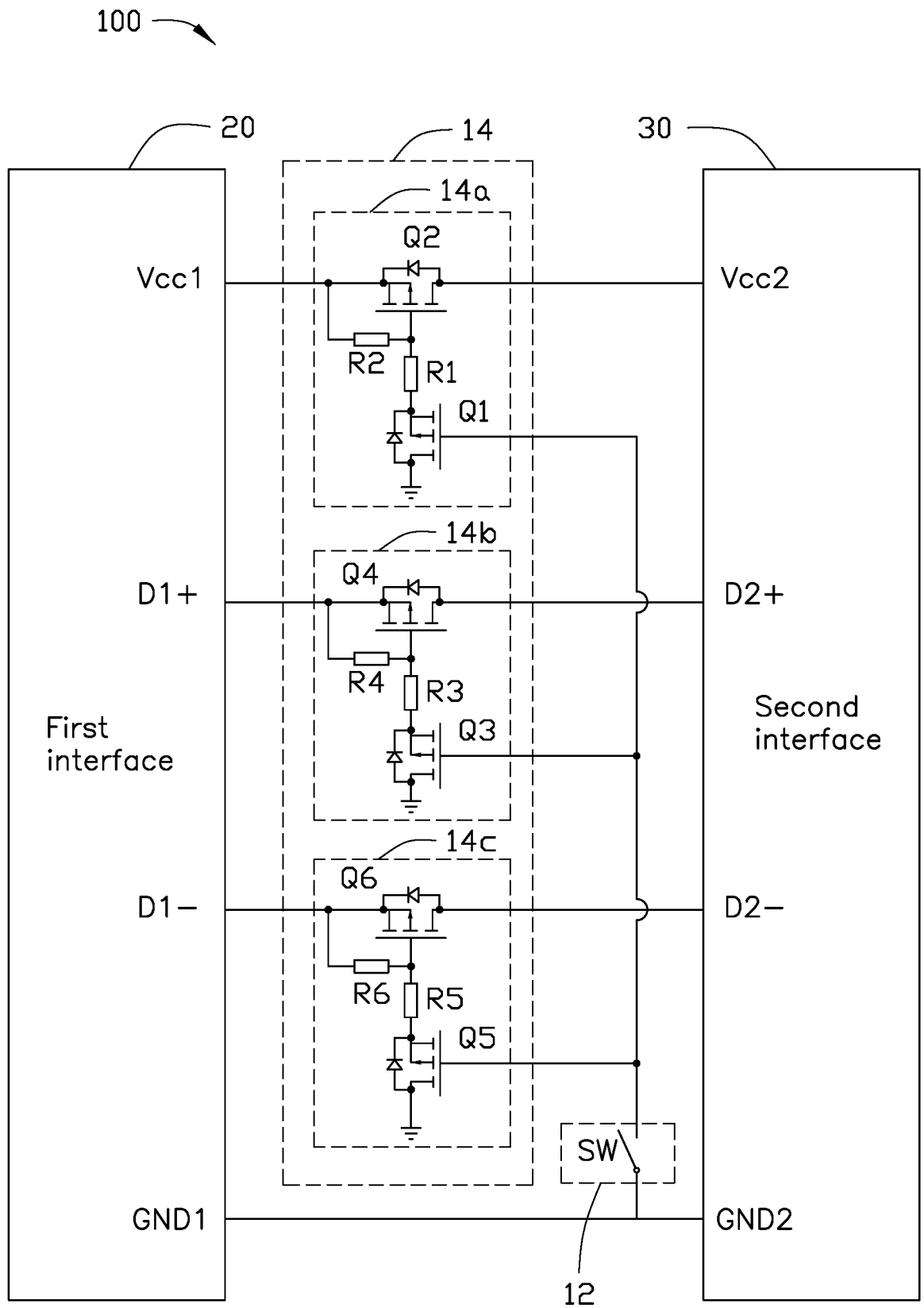
FIG. 3 is a circuit diagram of an embodiment of the USB device of FIG. 1.

FIG. 3 illustrates a circuit diagram of the device 100 in accordance with an embodiment of the present disclosure.

The first interface 20 includes a power pin Vcc1, a data pin D1+, a data pin D1−, and a ground pin GND1. The second interface 30 includes a power pin Vcc2, a data pin D2+, a data pin D2−, and a ground pin GND2.

In at least one embodiment, the first interface 20 and the second interface 30 can be USB interfaces.

The switching module 14 includes a switching unit 14a, a switching unit 14b, and a switching unit 14c.

The switching unit 14a is electrically coupled between the power pin Vcc1 of the first interface 20 and the power pin Vcc2 of the second interface 30. The switching unit 14b is electrically coupled between the data pin D1+ of the first interface 20 and the data pin D2+ of the second interface 30, and the switching unit 14c is electrically coupled between the data pin D1− of the first interface 20 and the data pin D2− of the second interface 30. The ground pin GND1 of the first interface 20 is electrically coupled to the ground pin GND2 of the second interface 30.

In at least one embodiment, the switching unit 14a includes two electronic switches Q1 and Q2 and two resistors R1 and R2.

A first terminal of the electronic switch Q1 is electrically coupled to the controlling module 12, a second terminal of the electronic switch Q1 is grounded, and a third terminal of the electronic switch Q1 is electrically coupled to a first terminal of the electronic switch Q2 through the resistor R1. A second terminal of the electronic switch Q2 is electrically coupled to the power pin Vcc2 of the second interface 30, and a third terminal of the electronic switch Q2 is electrically coupled to the power pin Vcc1 of the first interface 20. The first terminal of the electronic switch Q2 is electrically coupled to the power pin Vcc1 of the first interface 20 through the resistor R2.

In at least one embodiment, the switching unit 14b includes two electronic switches Q3 and Q4 and two resistors R3 and R4.

A first terminal of the electronic switch Q3 is electrically coupled to the controlling module 12, a second terminal of the electronic switch Q3 is grounded, and a third terminal of the electronic switch Q3 is electrically coupled to a first terminal of the electronic switch Q4 through the resistor R3.

A second terminal of the electronic switch Q4 is electrically coupled to the data pin D2+ of the second interface 30, a third terminal of the electronic switch Q4 is electrically coupled to the data pin D1+ of the first interface 20, and the first terminal of the electronic switch Q4 is electrically coupled to the data pin D1+ of the first interface 20 through the resistor R4.

In at least one embodiment, the switching unit 14c includes two electronic switches Q5 and Q6 and two resistors R5 and R6.

A first terminal of the electronic switch Q5 is electrically coupled to the controlling module 12, a second terminal of the electronic switch Q5 is grounded, and a third terminal of the electronic switch Q5 is electrically coupled to a first terminal of the electronic switch Q6 through the resistor R5.

A second terminal of the electronic switch Q6 is electrically coupled to the data pin D2− of the second interface 30, a third terminal of the electronic switch Q6 is electrically coupled to the data pin D1− of the first interface 20, and the first terminal of the electronic switch Q6 is electrically coupled to the data pin D1− of the first interface 20 through the resistor R6.

In at least one embodiment, the controlling module 12 includes a switch SW. The switch SW includes a first end and a second end.

The ground pin GND2 of the second interface 30 is electrically coupled to the first end of the switch SW, the first terminal of each of the electronic switches Q1, Q3, and Q5 is electrically coupled to the second end of the switch SW.

In at least one embodiment, the switch SW can be disposed on the second interface 30.

In at least one embodiment, the electronic switches Q1-Q6 can be P-type field effect transistors (P-FETs). The first terminal of the electronic switches Q1-Q6 can be a gate of the P-FETs, the second terminal of the electronic switches Q1-Q6 can be a drain of the P-FETs, and the third terminal of the electronic switches Q1-Q6 can be a source of the P-FETs.

When pressed on the switch SW turns on the connections between the first terminals of the electronic switches Q1, Q3, and Q5 and the ground pin GND2 of the second interface 30. The switch SW outputs the signal at low-voltage level to turn on the electronic switches Q1, Q3, and Q5, and the electronic switches Q2, Q4, and Q6 are thereby turned on. Therefore, the power pin Vcc1 of the first interface 20 is electrically coupled to the power pin Vcc2 of the second interface 30, and the data pin D1+ of the first interface 20 is electrically coupled to the data pin D2+ of the second interface 30. The data pin D1− of the first interface 20 is electrically coupled to the data pin D2− of the second interface 30, and the ground pin GND1 of the first interface 20 is electrically coupled to the ground pin GND2 of the second interface 30.

When pressed off the switch SW turns off the connections between the first terminals of the electronic switches Q1, Q3, and Q5 and the ground pin GND2 of the second interface 30. The switch SW outputs the signal at high-voltage level to turn off the electronic switches Q1, Q3, and Q5, and the electronic switches Q2, Q4, and Q6 are thereby turned off. Therefore, the power pin Vcc1, the data pin D1+, and the data pin D1− of the first interface 20 are respectively disconnected from the power pin Vcc2, the data pin D2+, and the data pin D2− of the second interface 30.

The protection circuit 10 can conveniently control the connection between the first interface 20 and the second interface 30 under the operation of the user.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A protection circuit, configured for coupling between a first interface and a second interface, comprising:
    a controlling module outputting a first control signal or a second control signal according to an operation of a user; and
    a switching module coupling between the first interface and the second interface;
    wherein the switching module receives the first control signal or the second control signal from the controlling module, and turns on or turns off the connection between the first interface and the second interface according to the first control signal or the second control signal, respectively;
    wherein the first interface comprises a first power pin, the second interface comprises a second power pin, the switching module comprises a first switching unit the first switching unit comprises a first electronic switch and a second electronic switch, a first terminal of the first electronic switch is electrically coupled to the controlling module, a second terminal of the first electronic switch is grounded, and a third terminal of the first electronic switch is electrically coupled to a first terminal of the second electronic switch, a second terminal of the second electronic switch is electrically coupled to the second power pin of the second interface, a third terminal of the second electronic switch is electrically coupled to the first power pin of the first interface, and the first terminal of the second electronic switch is electrically coupled to the first power pin of the first interface.

2. The protection circuit of claim 1, wherein the first interface further comprises a first data pin, a second data pin and a first ground pin, and the second interface further comprises a third data pin, a fourth data pin and a second ground pin; and the switching module further comprises a second switching unit and a third switching unit, the second switching unit is electrically coupled between the first data pin of the first interface and the third data pin of the second interface, the third switching unit is electrically coupled between the second data pin of the first interface and the fourth data pin of the second interface, and the first ground pin of the first interface is electrically coupled to the second ground pin of the second interface.

3. The protection circuit of claim 2, wherein the first switching unit further comprises a first resistor and a second resistor; the third terminal of the first electronic switch is electrically coupled to the first terminal of the second electronic switch through the first resistor; and the first terminal of the second electronic switch is electrically coupled to the first power pin of the first interface through the first resistor.

4. The protection circuit of claim 3, wherein the second switching unit comprises a third electronic switch, a fourth electronic switch, a third resistor and a fourth resistor; a first terminal of the third electronic switch is electrically coupled to the controlling module, a second terminal of the third electronic switch is grounded, and a third terminal of the third electronic switch is electrically coupled to a first terminal of the fourth electronic switch through the third resistor; and a second terminal of the fourth electronic switch is electrically coupled to the third data pin of the second interface, a third terminal of the fourth electronic switch is electrically coupled to the first data pin of the first interface, and the first terminal of the fourth electronic switch is electrically coupled to the first data pin of the first interface through the fourth resistor.

5. The protection circuit of claim 4, wherein the third switching unit comprises a fifth electronic switch, a sixth electronic switch, a fifth resistor and a sixth resistor; a first terminal of the fifth electronic switch is electrically coupled to the controlling module, a second terminal of the fifth electronic switch is grounded, and a third terminal of the fifth electronic switch is electrically coupled to a first terminal of the sixth electronic switch through the fifth resistor; and a second terminal of the sixth electronic switch is electrically coupled to the fourth data pin of the second interface, a third terminal of the sixth electronic switch is electrically coupled to the second data pin of the first interface, and the first terminal of the sixth electronic switch is electrically coupled to the second data pin of the first interface through the sixth resistor.

6. The protection circuit of claim 5, wherein the controlling module comprises a switch, and the switch comprises a first end and a second end; and the second ground pin of the second interface is electrically coupled to the first end of the switch, the first terminal of the first electronic switch, the third electronic switch and the fifth electronic switch are electrically coupled to the second end of the switch.

7. The protection circuit of claim 6, wherein the first to sixth electronic switches are a P-type field effect transistor (FET).

8. The protection circuit of claim 7, wherein the first terminals of the first to sixth electronic switches are a gate of the P-type FET, the second terminals of the first to sixth electronic switches are a drain of the P-type FET, and the third terminals of the first to sixth electronic switches are a source of the P-type FET.

9. The protection circuit of claim 6, wherein the switch is disposed on the second interface.

10. A universal serial bus (USB) device, comprising:
a first interface and a second interface; and
a protection circuit coupling between the first interface and the second interface, comprising:
a controlling module outputting a first control signal or a second control signal according to an operation of a user; and
a switching module coupling between the first interface and the second interface;
wherein the switching module receives the first control signal or the second control signal from the controlling module, and turns on or turns off the connection between the first interface and the second interface according to the first control signal or the second control signal, respectively;

wherein the first interface comprises a first power pin, the second interface comprises a second power pin, the switching module comprises a first switching unit the first switching unit comprises a first electronic switch and a second electronic switch, a first terminal of the first electronic switch is electrically coupled to the controlling module, a second terminal of the first electronic switch is grounded, and a third terminal of the first electronic switch is electrically coupled to a first terminal of the second electronic switch, a second terminal of the second electronic switch is electrically coupled to the second power pin of the second interface, a third terminal of the second electronic switch is electrically coupled to the first power pin of the first interface, and the first terminal of the second electronic switch is electrically coupled to the first power pin of the first interface.

11. The USB device of claim 10, wherein the first interface further comprises a first data pin, a second data pin and a first ground pin, and the second interface further comprises a third data pin, a fourth data pin and a second ground pin; and the switching module further comprises a second switching unit and a third switching unit, the second switching unit is electrically coupled between the first data pin of the first interface and the third data pin of the second interface, the third switching unit is electrically coupled between the second data pin of the first interface and the fourth data pin of the second interface, and the first ground pin of the first interface is electrically coupled to the second ground pin of the second interface.

12. The USB device of claim 11, wherein the first switching unit further comprises a first resistor and a second resistor; the third terminal of the first electronic switch is electrically coupled to the first terminal of the second electronic switch through the first resistor; and the first terminal of the second electronic switch is electrically coupled to the first power pin of the first interface through the first resistor.

13. The USB device of claim 12, wherein the second switching unit comprises a third electronic switch, a fourth electronic switch, a third resistor and a fourth resistor; a first terminal of the third electronic switch is electrically coupled to the controlling module, a second terminal of the third electronic switch is grounded, and a third terminal of the third electronic switch is electrically coupled to a first terminal of the fourth electronic switch through the third resistor; and a second terminal of the fourth electronic switch is electrically coupled to the third data pin of the second interface, a third terminal of the fourth electronic switch is electrically coupled to the first data pin of the first interface, and the first terminal of the fourth electronic switch is electrically coupled to the first data pin of the first interface through the fourth resistor.

14. The USB device of claim 13, wherein the third switching unit comprises a fifth electronic switch, a sixth electronic switch, a fifth resistor and a sixth resistor; a first terminal of the fifth electronic switch is electrically coupled to the controlling module, a second terminal of the fifth electronic switch is grounded, and a third terminal of the fifth electronic switch is electrically coupled to a first terminal of the sixth electronic switch through the fifth resistor; and a second terminal of the sixth electronic switch is electrically coupled to the fourth data pin of the second interface, a third terminal of the sixth electronic switch is electrically coupled to the second data pin of the first interface, and the first terminal of the sixth electronic switch is electrically coupled to the second data pin of the first interface through the sixth resistor.

15. The USB device of claim 14, wherein the controlling module comprises a switch, and the switch comprises a first end and a second end; and the second ground pin of the second interface is electrically coupled to the first end of the switch, the first terminal of the first electronic switch, the third electronic switch and the fifth electronic switch are electrically coupled to the second end of the switch.

16. The USB device of claim 15, wherein the first to sixth electronic switches are a P-type field effect transistor (FET).

17. The USB device of claim 16, wherein the first terminals of the first to sixth electronic switches are a gate of the P-type FET, the second terminals of the first to sixth electronic switches are a drain of the P-type FET, and the third terminals of the first to sixth electronic switches are a source of the P-type FET.

18. The USB device of claim 17, wherein the switch is disposed on the second interface.

19. The USB device of claim 10, wherein the first interface and the second interface are the USB interface.

* * * * *